United States Patent
Rapina et al.

(10) Patent No.: US 10,484,218 B2
(45) Date of Patent: Nov. 19, 2019

(54) PWM DEMODULATION

(71) Applicant: Invecas, Inc., Santa Clara, CA (US)

(72) Inventors: Siva Kumar Rapina, Bengaluru (IN); Saravana Kumar Durairaj, Bengaluru (IN)

(73) Assignee: Invecas, Inc., Santa Clara, CA (US)

( * ) Notice: Subject to any disclaimer, the term of this patent is extended or adjusted under 35 U.S.C. 154(b) by 0 days.

(21) Appl. No.: 15/904,139

(22) Filed: Feb. 23, 2018

(65) Prior Publication Data

US 2019/0268193 A1    Aug. 29, 2019

(51) Int. Cl.
*H04W 4/33* (2018.01)
*H04L 27/156* (2006.01)
*H03K 5/003* (2006.01)
*H03K 9/08* (2006.01)

(52) U.S. Cl.
CPC ......... *H04L 27/1566* (2013.01); *H03K 5/003* (2013.01); *H03K 9/08* (2013.01); *H04W 4/33* (2018.02)

(58) Field of Classification Search
USPC .............................................. 375/340; 341/70
See application file for complete search history.

(56) References Cited

U.S. PATENT DOCUMENTS

| | | | |
|---|---|---|---|
| 6,581,032 B1 * | 6/2003 | Gao | G10L 19/167 704/201 |
| 7,057,538 B1 * | 6/2006 | D'Amore | H04L 27/2035 341/158 |
| 7,471,143 B2 | 12/2008 | Kim | |
| 7,505,534 B1 * | 3/2009 | Xue | H04L 1/0045 375/340 |
| 8,411,804 B2 | 4/2013 | Subburaj et al. | |
| 8,564,365 B2 | 10/2013 | Dang et al. | |
| 9,100,264 B2 | 8/2015 | Huang et al. | |
| 9,407,249 B2 | 8/2016 | Seth et al. | |
| 9,425,781 B2 | 8/2016 | Nandy et al. | |
| 2009/0001946 A1 | 1/2009 | Mehas et al. | |
| 2011/0314321 A1 * | 12/2011 | Chard | H04L 25/0262 713/375 |
| 2013/0191679 A1 * | 7/2013 | Zhuang | H03L 7/0807 713/503 |
| 2017/0093521 A1 * | 3/2017 | Wang | H04L 1/0002 |
| 2018/0131361 A1 * | 5/2018 | Ewanchuk | H02M 1/088 |

* cited by examiner

*Primary Examiner* — Eva Y Puente
(74) *Attorney, Agent, or Firm* — Venture Pacific Law, PC

(57) ABSTRACT

A receiver for demodulating a pulse width modulated ("PWM") signal, comprises: a voltage level shifter for shifting the PWM signal to predefined transistor voltage levels; a half-rate PWM decoder for receiving the shifted PWM signal; and a 2-bit-to-N-bit deserializer. The half-rate PWM decoder comprises a first decoder core, a second decoder core, a controller, and a sampler and retiming circuit. The first decoder core and the second decoder core are configured to decode alternating periods of the shifted PWM signal. The controller is coupled to the first decoder core, the second decoder core, the sampler and retiming circuit. The retiming circuit is configured to receive clock signals from the controller and to output half-rate even data from the first decoder core and half-rate odd data from the second decoder core. Outputs of the retiming circuit and an output of the controller are coupled to inputs of the deserializer.

20 Claims, 8 Drawing Sheets

PWM DEMODULATION

FIELD OF INVENTION

The disclosure generally relates to demodulation of a pulse width modulated signal, and more particularly to demodulation using half-rate decoders.

BACKGROUND

Pulse width modulated ("PWM") serial data communication systems are proposed for many inter-chip communication standards such as MIPI MPHY. A PWM signal can have a major and minor pulse width which indicates a logic level 0 or 1 for each bit. The PWM bit period can be determined by falling and rising edges of the respective signal.

In general for a high-performance PWM transceiver system, an accurate clock source is required at the transmitter side and a power-hungry clock recovery circuit is required at the receiver side. However, for low power operation, the clock source and the clock recovery circuit should be avoided. Omitting such blocks from a transceiver system can reduce cost and chip area, but will cause jitter in the transceiver system. Therefore, a receiver needs to be able to tolerate a high amount of jitter from a low power transmitter.

Another drawback of a high-performance transceiver system is that an additional bit stream for bit synchronization, referred to as sync bits, is required for communication between the transmitter and the receiver. A phase locked loop ("PLL") or delay locked loop ("DLL") at the receiver side is required for data recovery, which requires a long lock time and uses more power and chip area. Many low power receiver techniques have been proposed that use a PLL or a DLL, but all of these techniques are prone to jitter.

Therefore, it is desirable to provide new methods, systems, and circuits for a low power PWM receiver that avoids the drawbacks associated with using a DLL or a PLL and can compensate for jitter.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced. The present disclosure may, however, be embodied in different forms and should not be construed as limited to the embodiments set forth herein. It is also appreciated that the terms such as "first", "second", "third", etc. are used to distinguish between elements such terms describe. These terms are not necessarily intended to indicate temporal or prioritization of such elements, unless otherwise explicitly stated.

A PWM demodulator scheme and implementation is proposed for accommodating jitter from the transmitter without having to use DLLs or PLLs and any corresponding sync-bits for those DLLs and PLLs. In addition, a PWM of the present disclosure can work across a wide PWM data rate range, consume lower power due to lower rate of operation (e.g., at a half rate), and use less chip area for demodulation.

Figure 1:
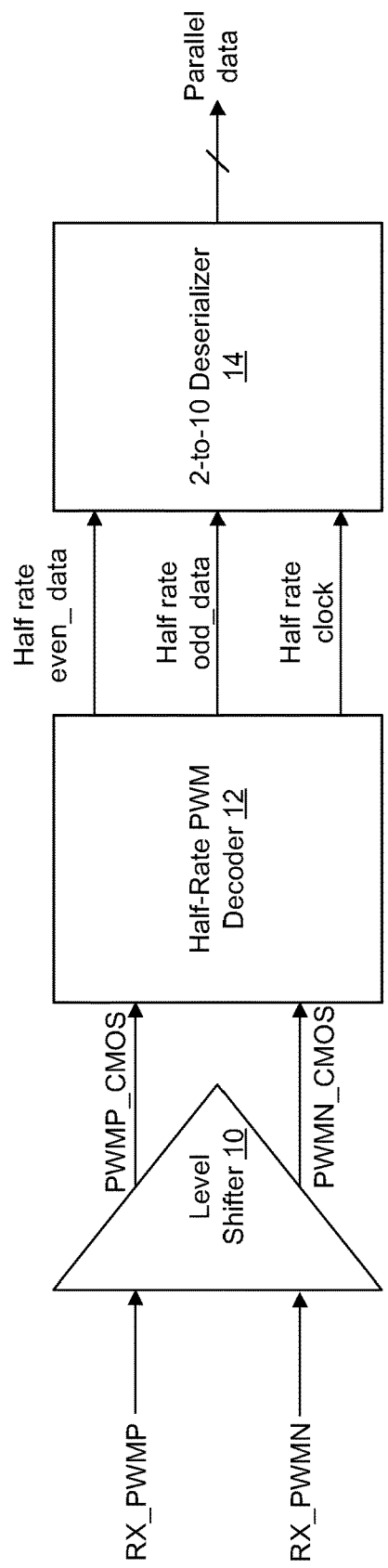
FIG. 1 illustrates a block diagram of a PWM receiver of the present disclosure.

FIG. 1 illustrates a block diagram of a PWM receiver of the present disclosure. A PWM receiver of the present disclosure can comprise a voltage level shifter 10, a half-rate PWM decoder 12, and a 2-bit to 10-bit deserializer 14 for deserializing the two half-rate data streams into a 10-bit parallel data output. The level shifter 10 can receive a differential PWM signal RX_PWMP and RX_PWMN and convert the differential signal from current mode logic ("CML") voltage levels to CMOS levels (or other predefined transistor voltage levels). In particular, the incoming low swing, differential common mode pad signal RX_PWMP and RX_PWMN is converted to a full swing differential signal PWMP_CMOS and PWMN_CMOS. The level shifter 10 may also be known as a CML-to-CMOS converter, which is well known in the art.

For a differential signal, to aid in distinguishing the pair of differential signals, one of the pair of differential signals can be referred to as a positive signal and the other one of the pair of differentials can be referred to as a negative signal. For instance, the PWMP_CMOS signal can be referred to as the positive signal of the differential pair and the PWMN_CMOS signal can be referred to as a negative signal of the differential pair. However, such terminology is only meant for identification and is not meant to indicate any value, attribute, temporal order, or prioritization of such signals of the respective differential signal.

The full swing differential signal PWMP_CMOS and PWMN_CMOS is inputted to the half-rate PWM decoder 12 for driving the half-rate PWM decoder cores that will decode the PWM bits to a logic level "1" or "0". The half-rate PWM decoder 12 can demodulate the converted differential signal in two parts by applying a half-rate demodulation scheme. The two half-rate output data and a half-rate clock are outputted by the decoder 12 to the deserializer 14.

The deserializer 14 can be a 2-bit to 10-bit deserializer. The deserializer 14 receives the two half-rate data outputs, half-rate even_data and half-rate odd_data, and the half rate clock. The deserializer 14 can combine the half-rate even_data and the half rate odd_data to output 10 bits of data in parallel. In some PWM conventions, the 10-bit parallel output can form a data symbol. Thereby, the half-rate PWM decoder 12 can demodulate the incoming CMOS level signals PWMP_CMOS and PWMN_CMOS to half-rate logic level 1's or 0's, where a half-rate recovered clock signal 2T can also be used to demodulate the half-rate data at a 1/10th data rate as per M-PHY standard.

It can be appreciated that deserializers are well known in the art and can also be known as serial-to-parallel converters. Furthermore, it can be appreciated that a number of data bits for the parallel output from the deserializer can be predefined to fit any PWM scheme. For instance, once the predefined number of data bits are received by the deserializer, the deserializer can output the data bits in parallel to fit a particular format for the respective PWM scheme.

Figure 2:
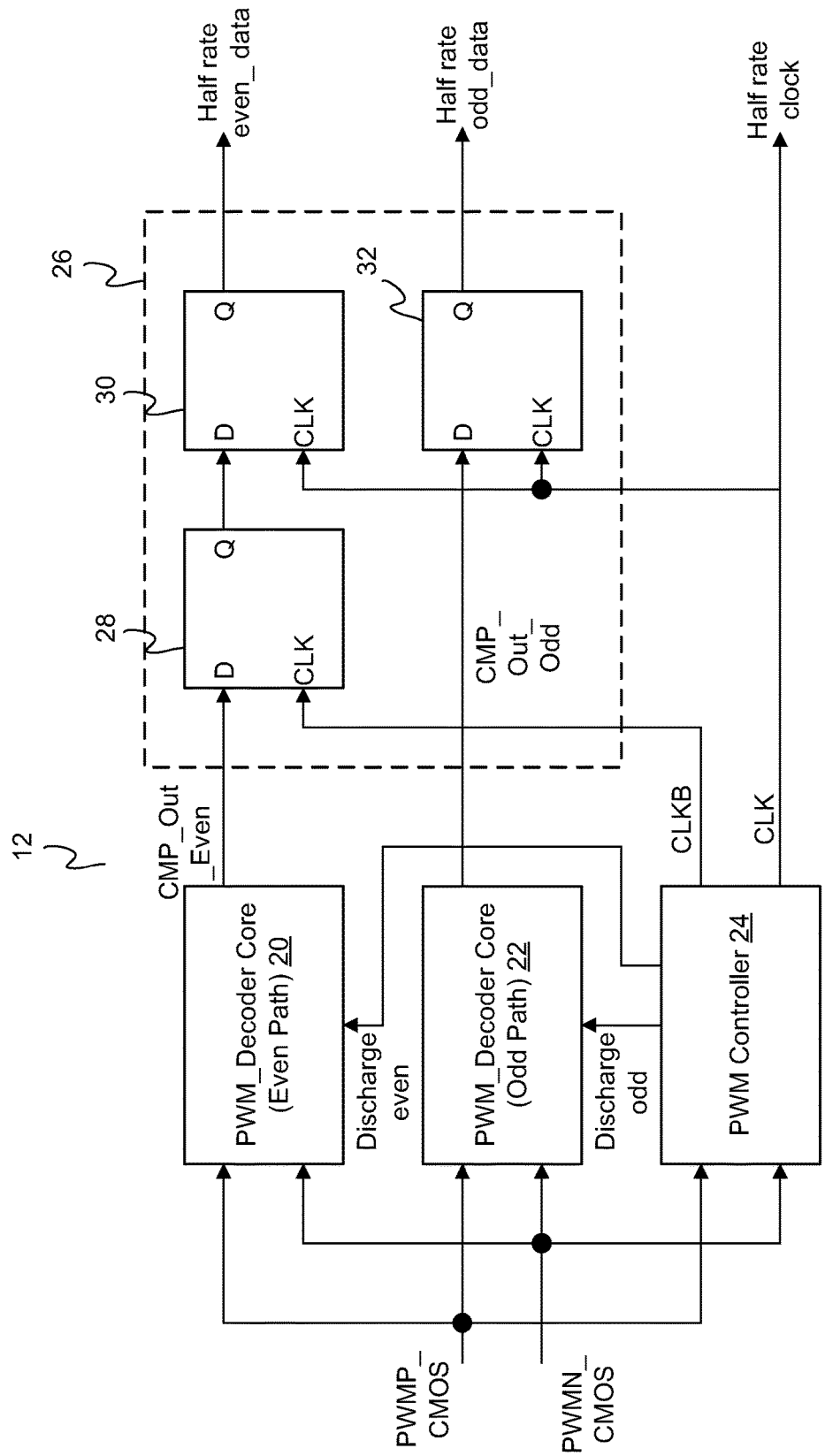
FIG. 2 illustrates a block diagram of a half-rate PWM decoder of the present disclosure.

FIG. 2 illustrates a block diagram of a half-rate PWM decoder of the present disclosure. The half-rate PWM decoder 12 comprises a PWM decoder core 20, a PWM decoder core 22, a PWM controller 24, and a sample and retiming circuit 26. The PWM decoder core 20 decodes an even PWM data of the inputted differential signal PWMP_CMOS and PWMN_CMOS and the PWM decoder 22 core decodes an odd PWM data of the inputted differential signal PWMP_CMOS and PWMN_CMOS.

The even data path and the odd data path can be used to distinguish which periods of the differential signal PWMP_CMOS and PWMN_CMOS are decoded by which decoder core. In one embodiment, the PWM decoder core 20 and the PWM decoder core 22 can alternate between periods of the differential signal PWMP_CMOS and PWMN_CMOS. For instance, the PWM decoder core 20 decodes a first period of the differential signal for a first bit, next the PWM decoder core 22 decodes a second period of the differential signal for a second bit, then decoding alternates back to the PWM decoder core 20 and can continue in such alternating fashion for decoding of the differential signal. When one of the PWM decoder cores 20 and 22 is not decoding, that decoder core can be deactivated or otherwise disabled.

In an embodiment of the present disclosure for a PWM decoder, a clock signal CLK having twice the period of the differential signal PWMP_CMOS and PWMN_CMOS can be used for determining an even path and an odd path. The even path can start at the rising edge of the CLK signal and can last for half a period of the CLK signal and the odd path can start at falling edge of the CLK signal and can last for half a period of the CLK signal. Thus, the CLK signal and its negated counterpart CLKB can be used as control signals to activate or deactivate the PWM decoder core 20 and 22 in accordance with the half-rate decoding scheme.

The differential signal PWMP_CMOS and PWMN_CMOS is inputted to the PWM decoder core 20, PWM decoder 22, and the PWM controller 24. The PWM decoder core 20 decodes the even PWM data of the differential signal and outputs the even PWM data decoded data CMP_Out_Even to the sample and retiming circuit 26. The PWM decoder core 22 decodes the odd path of the differential signal and outputs the odd path decoded data CMP_Out_Odd to the sample and retiming circuit 26.

The sample and retiming circuit 26 comprises flip-flops 28-32 for retiming the CMP_Out_Even data and the CMP_Out_Odd data. The PWM controller 24 can generate the CLK and CLKB signals to have a period that is twice as long as the differential signal PWMP_CMOS and PWMN_CMOS and aligned with the differential signal PWMP_CMOS and PWMN_CMOS. The CLK and CLKB signals are used to clock the flip-flops 28-32 of the sample and retiming circuit 26. The CLK and CLKB signals can also be used as control signals for operating the PWM decoder cores 20 and 22. For instance, the CLKB signal can be used as a discharge even signal for the decoder core 20 and the CLK signal can be used as a discharge odd signal for the decoder core 22.

The CLKB signal is used to clock the flip-flop 28. The CMP_Out_Even data is inputted to the data input of the flip-flop 28. The data output of the flip-flop 28 is coupled to the data input of the flip-flop 30. The CLK signal is used to clock the flip-flop 30 and 32. The data output of the flip-flop 30 provides the half-rate even data. The CMP_Out_Odd data is inputted to the data input of the flip-flop 32, and the data output of the flip-flop 32 provides the half-rate odd data. The sample and retiming circuit 26 can align both the half-rate even data and the half-rate odd data with the CLK signal for output to the deserializer 14. The CLK signal from the controller 24 can also be outputted to the deserializer 14.

Figure 3:
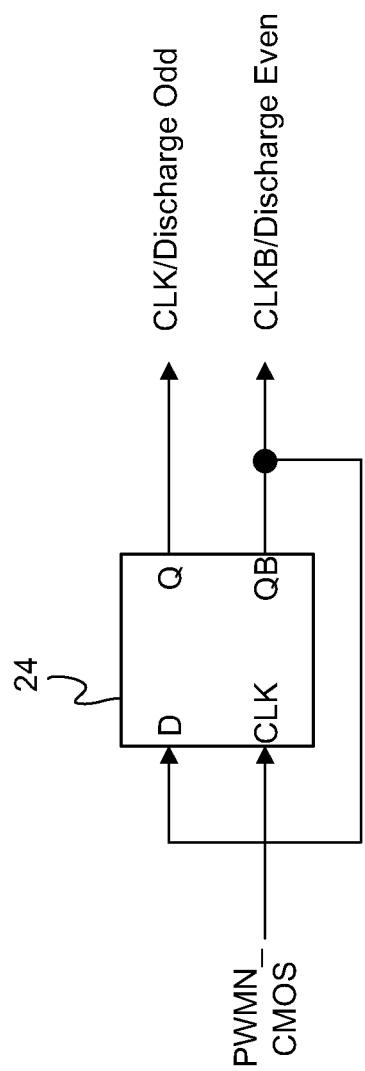
FIG. 3 illustrates a diagram of a PWM controller of a half-rate PWM decoder of the present disclosure.

FIG. 3 illustrates a diagram of a PWM controller of a half-rate PWM decoder of the present disclosure. In an embodiment of the present disclosure, the PWM controller 24 is a flip-flop having a data input D coupled to a negated data output QB and is clocked by one of the differential signals PWMP_CMOS and PWMN_CMOS, e.g., the signal PWMN_CMOS. When using the PWMN_CMOS signal, the negated data output is the CLKB signal and a data output Q is the CLK signal. The CLKB signal can be the discharge signal for the PWM decoder core 20 and the CLK signal can be the discharge signal for the PWM decoder core 22. It can be appreciated that the PWMP_CMOS signal can also be used to generate a clock signal and a negated clock signal.

For a fixed-ratio format for the PWM signal, the bit period is fixed, i.e., the time between two falling edges of the incoming PWM data stream. This can be used to generate the clock signal CLK for the sampling. Also, for the even and odd bit streams, one bit from one stream can be decoded at the falling edge of the clock signal CLK and one bit from the other stream can be decoded on the rising edge of the clock signal CLK. The two decoded bit streams can be retimed with the rising edge of the clock signal CLK for output to the deserializer.

Figure 4:
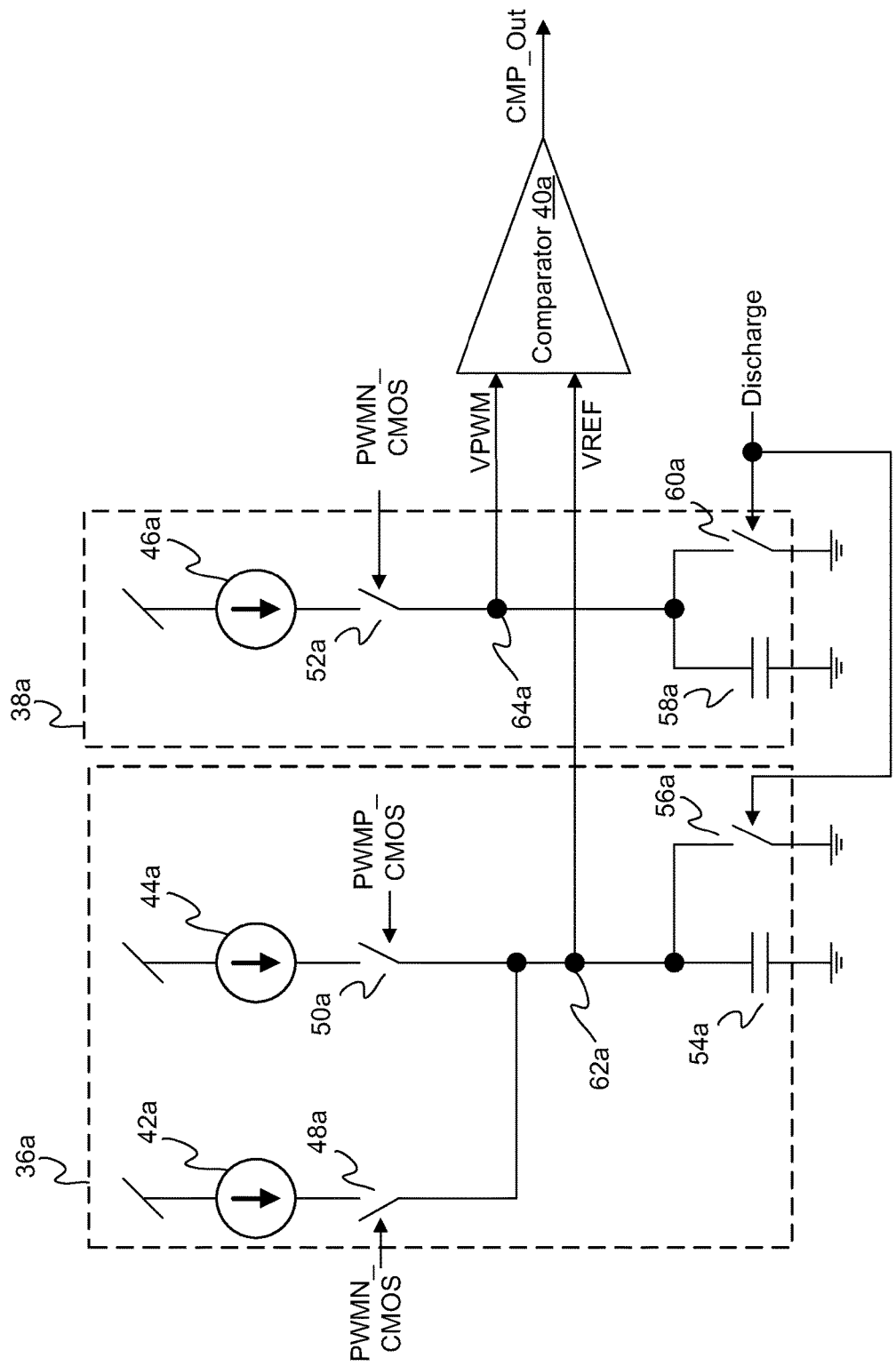
FIG. 4 illustrates a circuit diagram of an embodiment of a half-rate PWM decoder core of the present disclosure.

FIG. 4 illustrates a circuit diagram of an embodiment of a half-rate decoder core of the present disclosure. A PWM decoder core comprises integrators 36a and 38a and a comparator 40a. The integrator 36a comprises current sources 42a and 44a, switches 48a, 50a, and 56a, and a capacitor 54a. The current source 42a and the switch 48a are serially connected across a supply voltage and a node 62a. The switch 48a is operated by the signal PWMN_CMOS, such that when the signal PWMN_CMOS is high, the switch 48a is closed and when the signal PWMN_CMOS is low, the switch 48a is opened. The current source 44a and the switch 50a are serially connected across the supply voltage and the node 62a. The switch 50a is operated by the signal PWMP_CMOS, such that when the signal PWMP_CMOS is high, the switch 50a is closed and when the signal PWMP_CMOS is low, the switch 50a is opened. The capacitor 54a and the switch 56a are connected in parallel across the node 62a and ground. A voltage VREF at the node 62a can be sensed by the comparator 40a.

The integrator 38a comprises a current source 46a, a switch 52a, a capacitor 58a, and a switch 60a. The current source 46a and the switch 52a are serially connected across the supply voltage and a node 64a. The capacitor 58a and the switch 60a are connected in parallel across the node 64a and ground. A voltage VPWM at the node 64a can be sensed by the comparator 40a.

The switches 56a and 60a are controlled by a discharge signal that is generated by the PWM controller 24. If the PWM decoder is used for the even path PWM decoder corer 20, then the discharge signal used is the CLKB signal. If the PWM decoder is used for the odd path PWM decoder corer 22, then the discharge signal used is the CLK signal.

Furthermore, it can be appreciated that different embodiments of a PWM decoder core can be used in a single half-rate PWM demodulator. For instance, the PWM decoder core 20 for an even path can be implemented by the decoder illustrated in FIG. 4 and the PWM decoder core 22 for an odd path can be implemented by the decoder illustrated in FIG. 5.

Referring to FIG. 4, in an embodiment, the current sources 42a, 44a, and 46a can each generate a current Ipwm. Also, the capacitor 54a has a capacitance 2C that is twice a capacitance C of the capacitor 58a. The integrator 36a will charge for a complete period of the differential signal PWMN_CMOS and PWMP_CMOS. The other integrator 38a will charge for a positive portion of the PWMN_CMOS signal. The voltages VREF and VPWM generated by the two integrators 36a and 38a can then be compared by the comparator 40a to determine if there is any voltage crossing to indicate whether the respective bit for the PWM period is a logic level "1" or a "0".

It can be appreciated that in other embodiments the current and capacitance values for the elements of the integrators 36a and 38a can be varied to obtain the voltages VREF and VPWM. For instance, the current sources 42a and 44a can instead generate a current Ipwm/2 and the current source 46a can generate a current Ipwm. Also, the capacitor 54a and the capacitor 58a can each have a capacitance C. In this manner, the voltages VREF and VPWM can be generated for the purpose of indicating whether the respective bit for the PWM period is a logic level "1" or a "0".

The comparator 40a compares the two voltages VREF and VPWM. When the voltage VREF is greater than the voltage VPWM then the comparator 40a's output will go to a logic high level, i.e., 1. When the voltage VREF is less than the voltage VPWM then the comparator 40a's output will go to a logic low level (e.g., ground or 0). If the discharge signal is high, then the switches 56a and 60a are closed, shorting the voltages VPWM and VREF to ground. This will in turn reset the comparator 40a's output to ground and will also discharge the capacitors 54a and 58a, effectively deactivating the respective decoder core.

The outputs at the nodes 62a and 64a of the integrators 36a and 38a can be renamed as VREF_EVEN and VPWM_EVEN for an even path PWM decoder core or VREF_ODD and VPWM_ODD for an odd path PWM decoder core.

Operationally, the VPWM_EVEN signal or the VPWM_ODD signal charges for an on-time period (i.e., when the signal is high) of PWMN_CMOS signal, and stays off for the remainder. If the transmitting bit is a logic low, e.g., "0", there is no voltage crossing between the voltages VPWM and VREF and thus the comparator 40a's output will stay low. If the transmitting bit is a logic high, e.g., "1", the voltage crossing between the voltages VPWM and VREF trigger the comparator 40a's output to go high.

Figure 5:
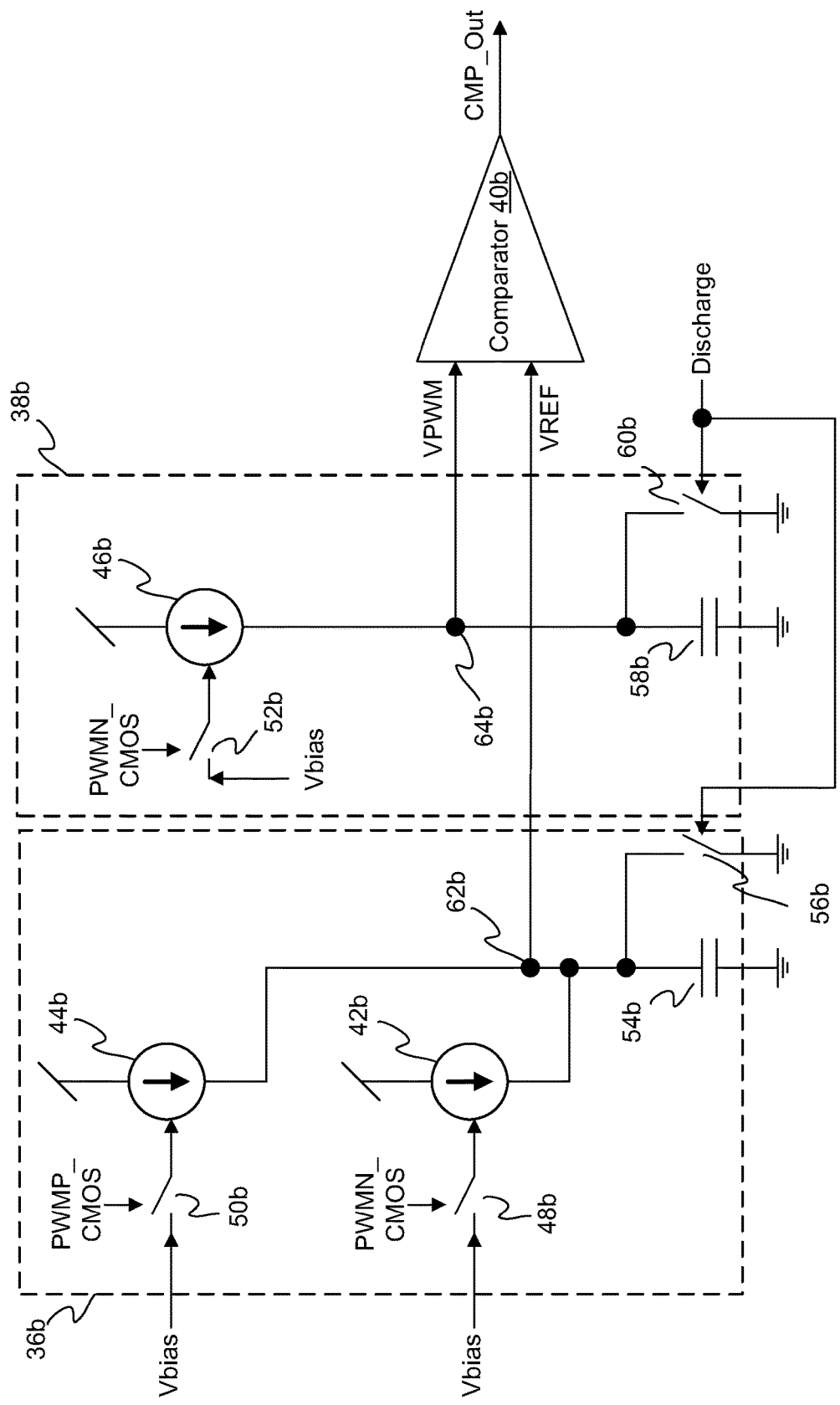
FIG. 5 illustrates a circuit diagram of another embodiment of a half-rate PWM decoder core of the present disclosure.

FIG. 5 illustrates a circuit diagram of another embodiment of a half-rate decoder core of the present disclosure. A PWM decoder core comprises integrators 36b and 38b and a comparator 40b. The integrator 36b comprises current sources 42b and 44b, switches 48b, 50b, and 56b and a capacitor 54b. The current source 42b is biased by a bias voltage Vbias via the switch 48a. The switch 48b is operated by the signal PWMN_CMOS, such that when the signal PWMN_CMOS is high, the switch 48b is closed and when the signal PWMN_CMOS is low, the switch 48b is opened. The current source 44b is biased by the bias voltage Vbias via the switch 50b. The switch 50b is operated by the signal PWMP_CMOS, such that when the signal PWMP_CMOS is high, the switch 50b is closed and when the signal PWMP_CMOS is low, the switch 50b is opened. The capacitor 54b and the switch 56b are connected in parallel across a node 62b and ground. The current sources 42b and 44b are coupled to the node 62b for driving a current to the capacitor 54b when one of the current sources 42b and 44b is on, e.g., when the respective switch is closed and the Vbias is applied to the respective current source. A voltage VREF at the node 62b can be sensed by the comparator 40b.

The integrator 38b comprises a current source 46b, a switch 52b, a capacitor 58b, and a switch 60b. The current source 46b is biased by the bias voltage Vbias via the switch 52b. The capacitor 58b and the switch 60b are connected in parallel across a node 64b and ground. The current source 46b is coupled to the node 64b for driving a current to the capacitor 58b when the respective current source is on, e.g., when the switch 52b is closed and the Vbias is applied to the current source 46b. A voltage VPWM at the node 64b can be sensed by the comparator 40b.

The switches 56b and 60b are controlled by a discharge signal that is generated by the PWM controller 24. If the PWM decoder is used for the even path PWM decoder core 20, then the discharge signal is the CLKB signal. If the PWM decoder is used for the odd path PWM decoder corer 22, then the discharge signal is the CLK signal.

In an embodiment, the current sources 42b, 44b, and 46b can each generate a current Ipwm when biased. Also, the capacitor 54b has a capacitance 2C that is twice a capacitance C of the capacitor 58b. The integrator 36b will charge for a complete period of the differential signal PWMN_CMOS and PWMP_CMOS. The other integrator 38b will charge for a positive portion of the PWMN_CMOS signal. The voltages VREF and VPWM generated by the two integrators 36b and 38b can then be compared by the comparator 40b to determine if there is any voltage crossing to indicate whether the bit for the PWM period is a logic level "1" or a "0".

It can be appreciated that in other embodiments the current and capacitance values for the circuit elements of the integrators 36b and 38b can be varied to obtain the voltages VREF and VPWM. For instance, the current sources 42b and 44b can instead be set to generate a current Ipwm/2 and the current source 46b can be set to generate a current Ipwm. Also, the capacitor 54b and the capacitor 58b can each have a capacitance C. In this manner, the voltages VREF and VPWM can be generated for indicating whether the bit for the PWM period is a logic level "1" or a "0".

The comparator 40b compares the two voltages VREF and VPWM. When the voltage VREF is greater than the voltage VPWM then the comparator 40b's output will go to a logic high level. When the voltage VREF is less than or equal to the voltage VPWM then the comparator 40b's output will go to a logic low level (e.g., ground). If the discharge signal is high, then the switches 56b and 60b are closed, shorting the voltages VPWM and VREF to ground. This will in turn reset the comparator 40b's output to ground and will also discharge the capacitors 54b and 58b, effectively deactivating the respective decoder core.

The outputs at the nodes 62b and 64b of the integrators 36b and 38b can be renamed as VREF_EVEN and VPWM_EVEN for an even path PWM decoder core or VREF_ODD and VPWM_ODD for an odd path PWM decoder core.

Operationally, the VPWM_EVEN signal or the VPWM_ODD signal charges for an on-time period (i.e., when the signal is high) of PWMN_CMOS signal, and stays off for the remainder. If the transmitting bit is a logic low, e.g., "0", there is no voltage crossing between the voltages VPWM and VREF and thus the comparator 40b's output will stay low. If the transmitting bit is a logic high, e.g., "1", the voltage crossing between the voltages VPWM and VREF trigger the comparator 40b's output to go high.

Figure 6:
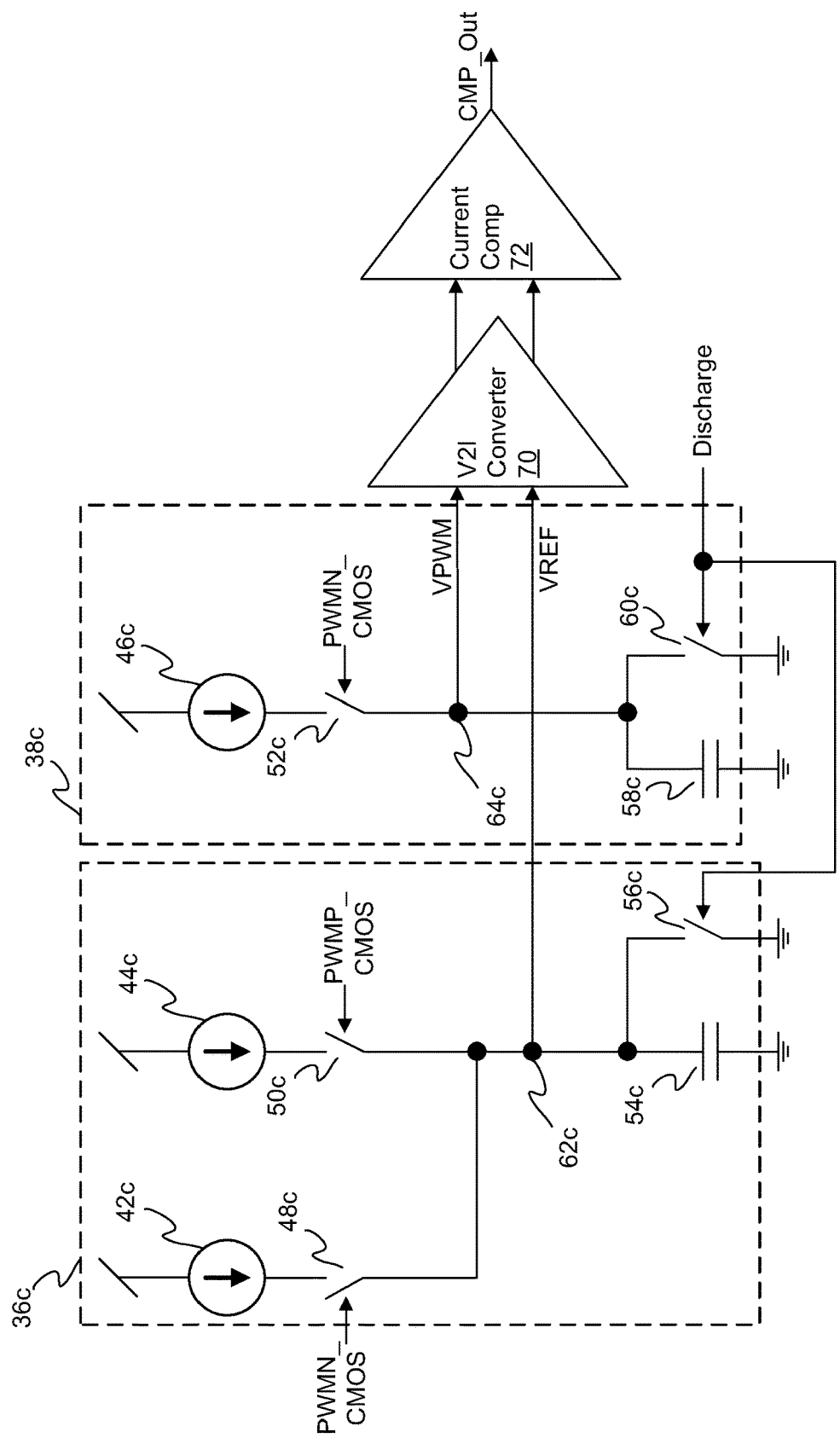
FIG. 6 illustrates a circuit diagram of yet another embodiment of a half-rate PWM decoder core of the present disclosure.

FIG. 6 illustrates a circuit diagram of yet another embodiment of a half-rate decoder core of the present disclosure. In an embodiment of the present disclosure, instead of using a comparator 40a, as illustrated in FIG. 4, to compare the generated voltages VPWM and VREF, an equivalent circuit can be used for the comparison. For instance, referring to FIG. 6, a voltage-to-current ("V2I") converter 70 and a current comparator 72 can be used in place of a voltage comparator.

A PWM decoder core can comprise integrators 36c and 38c, the V2I converter 70, and the current comparator 72. The integrator 36c comprises current sources 42c and 44c, switches 48c, 50c, and 56c and a capacitor 54c. The integrator 38c comprises a current source 46c, a switch 52c, a capacitor 58c, and a switch 60c. The integrators 36c and 38c can be operated and configured in the manner described for the PWM decoder core illustrated in FIG. 4.

Referring to FIG. 6, the VPWM voltage at a node 64c of the integrator 38c and the VREF voltage at a node 62c of the integrator 36c can be applied to the V2I converter 70 to be converted to corresponding currents. The converted currents can then be outputted from the V2I converter 70 to the current comparator 72 for comparison. The current comparator 72 can determine if there is any current crossing between the compared currents relating to the voltages VPWM and VREF to indicate whether the bit for the PWM period is a logic level "1" or a "0". For instance, when the converted current for the voltage VREF is greater than the converted current for the voltage VPWM, the current comparator 72's output will go to a logic high level. When the converted current for voltage VREF is less than the converted current for the voltage VPWM, the current comparator 72's output will go to a logic low level (e.g., ground).

Figure 7:
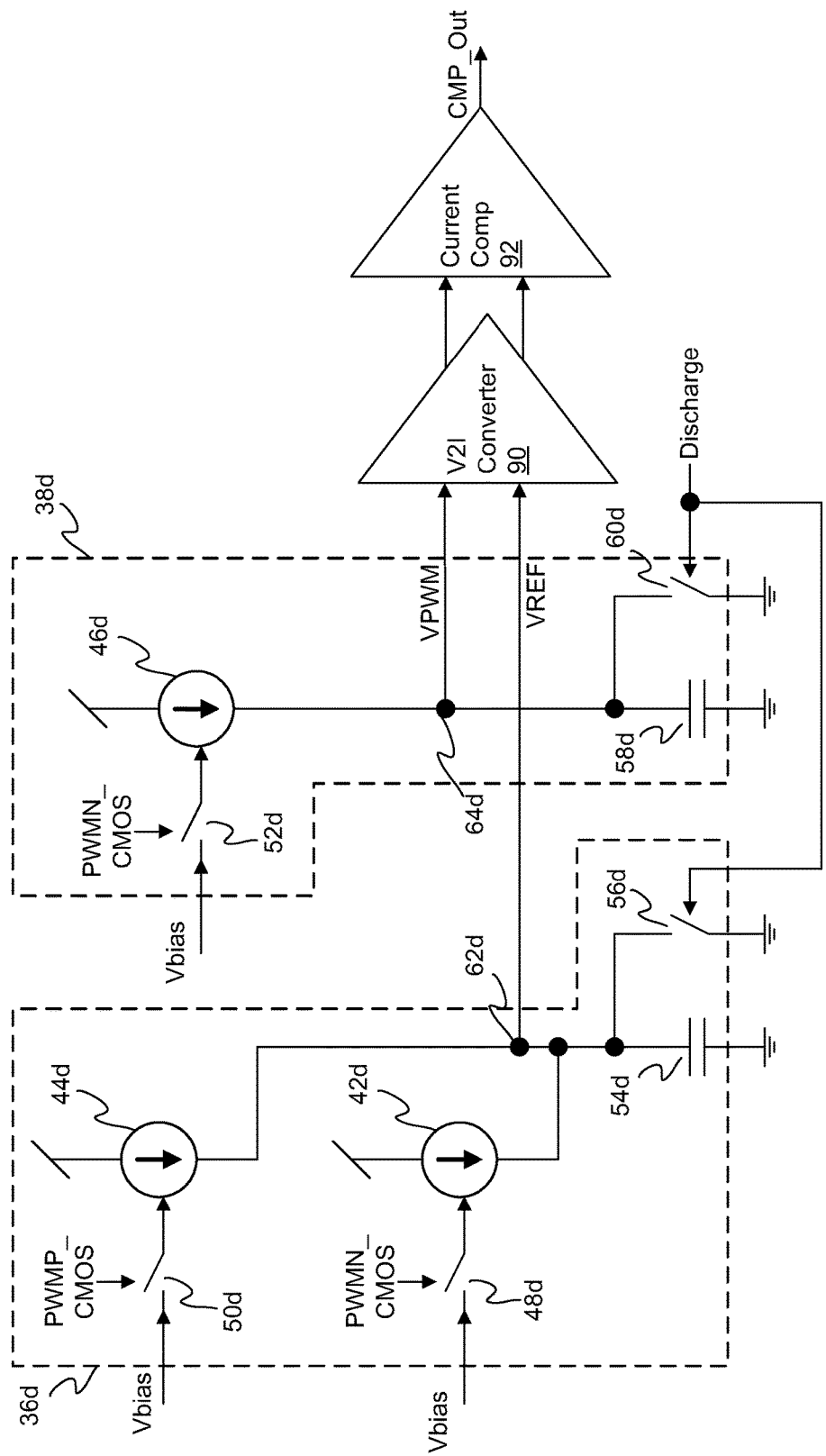
FIG. 7 illustrates a circuit diagram of an additional embodiment of a half-rate PWM decoder core of the present disclosure.

FIG. 7 illustrates a circuit diagram of an additional embodiment of a half-rate decoder core of the present disclosure. In another embodiment of the present disclosure, instead of using a comparator 40b, as illustrated in FIG. 5, to compare the generated voltages VPWM and VREF, an equivalent circuit can be used for the comparison. For instance, referring to FIG. 7, a V2I converter 90 and a current comparator 92 can be used in place of a voltage comparator.

A PWM decoder core can comprise integrators 36d and 38d, the V2I converter 90, and the current comparator 92. The integrator 36d comprises current sources 42d and 44d, switches 48d, 50d, and 56d and a capacitor 54d. The integrator 38d comprises a current source 46d, a switch 52d, a capacitor 58d, and a switch 60d. The integrators 36d and 38d can be operated and configured in the manner described for the PWM decoder core illustrated in FIG. 5.

Referring to FIG. 7, the VPWM voltage at a node 64d of the integrator 38d and the VREF voltage at a node 62d of the integrator 36d can be applied to the V2I converter 90 to be converted to corresponding currents. The converted currents can then be outputted from the V2I converter 90 to the current comparator 92 for comparison. The current comparator 92 can determine if there is any current crossing between the compared currents relating to the voltages VPWM and VREF to indicate whether the bit for the PWM period is a logic level "1" or a "0". For instance, when the converted current for the voltage VREF is greater than the converted current for the voltage VPWM, the current comparator 92's output will go to a logic high level. When the converted current for voltage VREF is less than the converted current for the voltage VPWM, the current comparator 92's output will go to or stay at a logic low level (e.g., ground or 0).

Figure 8:
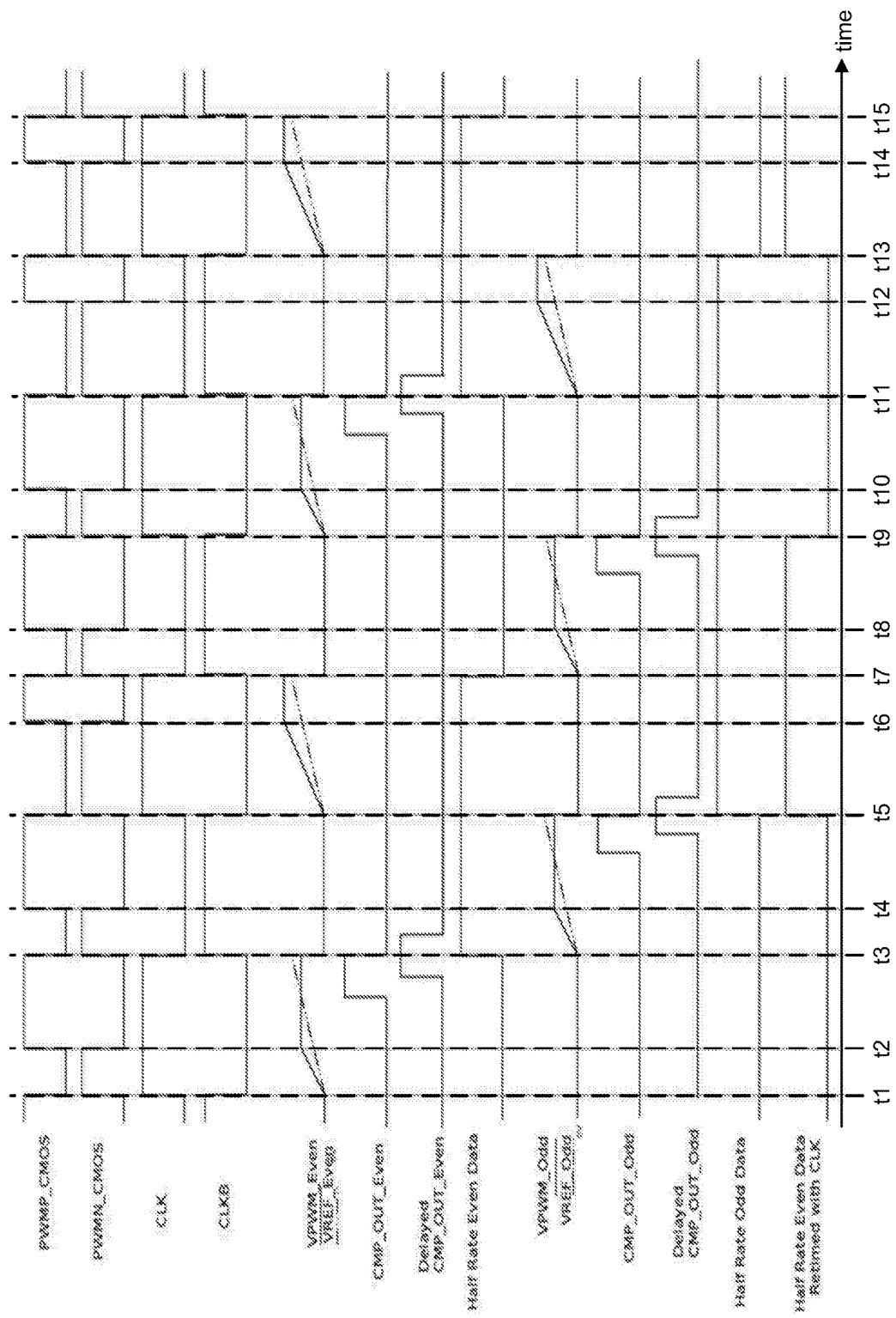
FIG. 8 illustrates a timing diagram for control and data signals used in an embodiment of a half-rate PWM decoder of the present disclosure.

FIG. 8 illustrates a timing diagram for control and data signals used in an embodiment of a half-rate decoder of the present disclosure. In order to aid in the understanding of the present disclosure, a timing diagram for various signals of a PWM demodulator of the present disclosure is presented, where the various signals are plotted in parallel along a time axis to aid in understanding the operation of the PWM demodulator.

The PWM demodulator can comprise two PWM decoder cores, one PWM decoder core for processing an even PWM data for the inputted differential signal and one PWM decoder core for processing an odd PWM data for the differential signal. In order to distinguish the two decoder cores, the decoder core for decoding the even path can have VPWM_EVEN and VREF_EVEN to correspond with VPWM and VREF (illustrated in the embodiments of a decoder core of the present disclosure). The decoder core for decoding the odd path can have VPWM_ODD and VREF_Odd to correspond with VPWM and VREF (illustrated in the embodiments of a decoder core of the present disclosure).

As such, the PWMP_CMOS and the PWMN_CMOS signals can be the differential signals outputted by the level shifter 10, illustrated in FIG. 1. The CLK and CLKB signals can be generated by the PWM controller 24, illustrated in FIGS. 2 and 3.

The VPWM_Even signal (illustrated by a solid line) and the VREF_Even signal (illustrated by a dotted line) can be generated by the PWM decoder core for decoding the even path. The CMP_OUT_Even signal is the comparator output of the PWM decoder core for decoding the even path. The delayed CMP_OUT_Even signal is a delayed version of the CMP_OUT_Even signal. The half-rate even_data is the output of the PWM decoder core for decoding the even path.

The VPWM_Odd signal (illustrated by a solid line) and the VREF_Odd signal (illustrated by a dotted line) can be generated by the PWM decoder core for decoding the odd path for comparison. The CMP_OUT_Odd signal is the comparator output of the PWM decoder core for decoding the odd path. The delayed CMP_OUT_Odd signal is a delayed version of the CMP_OUT_Odd signal. The half-rate odd data is the output of the PWM decoder core for decoding the odd path.

The half-rate even data retimed with CLK signal is the half-rate even data retimed by the sample and retiming circuit 26 (illustrated in FIG. 2) to match with the timing of the half-rate odd data.

Referring to FIG. 8, the CLK and CLKB signals are generated based on the differential signal PWMP_CMOS and PWMN_CMOS as discussed earlier. During a first clock cycle at time t1, an even path can be decoded and the odd path is deactivated. For the even path decoding, the PWM decoder core for the even path charges the voltage VPWN_Even during the time the PWMN_CMOS signal is positive. When the PWMN_CMOS signal goes to a low logic level (e.g., ground) at time t2, the voltage VPWN_Even remains at its last voltage value. The voltage VREF_Even is charged from time t1 to t3 for the entire first period of the differential signal PWMP_CMOS and PWMN_CMOS. If voltage VREF_Even crosses the voltage VPWN even, then the first period of the differential signal from time t1 to time t3 is decoded as a logic high bit or "1" bit. If voltage VREF_Even does not cross the voltage VPWN_Even, the first period of the differential signal from time t1 to time t3 is decoded as a logic low or "0" bit. Once the period is over, then the PWM decoder core for the even path is reset using the CLKB signal. The delayed CMP_OUT_Even signal is a delayed version of the CMP_OUT_Even signal, so that at time t3 it can be determined what the comparator output result has been determined.

Next, an odd path decoding is performed between a next period of the differential signal from time t3 to time t5. For the odd path decoding, the PWM decoder core for the odd path charges the voltage VPWN_Odd during the time the PWMN_CMOS signal is positive. When the PWMN_CMOS signal goes to a low logic level (e.g., ground) at time t4, the voltage VPWN_Odd remains at its last voltage value. The voltage VREF_Odd is charged from time t3 to t5 for the entire second period of the differential signal PWMP_CMOS and PWMN_CMOS. If the voltage VREF_Odd crosses the voltage VPWN_Odd, the second period of the differential signal from time t3 to time t5 is decoded as a logic high bit or "1" bit. If the voltage VREF_Odd does not cross the voltage VPWN_Odd, the second period of the differential signal from time t3 to time t5 is decoded as a logic low or "0" bit. Once the second period is over, the PWM decoder core for the odd path is reset using the CLK signal. The delayed CMP_OUT_Even is a delayed version of the CMP_OUT_Even signal, so that at time t3 it can be determined what the comparator output result has been determined The half-rate even data is retimed so that it can be outputted in parallel with the half-rate odd data at time t5. It can be appreciated that the retimer is an optional step since the half-rate even data and the half-rate odd data can be outputted to a deserializer once it has been determined.

The PWM decoder core for the even path decodes the next period starting at time t5 and ending at time t7. The two decoder cores go back and forth each decoding one bit that corresponds to one period of the differential signal PWMP_CMOS and PWMN_CMOS.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

We claim:

1. A receiver for demodulating a pulse width modulated ("PWM") signal,
   comprising:
   a voltage level shifter for shifting the PWM signal to predefined transistor voltage levels;
   a half-rate PWM decoder for receiving the shifted PWM signal, wherein the half-rate PWM decoder comprises a first decoder core, a second decoder core, a controller, and a sampler and retiming circuit, wherein the first decoder core and the second decoder core are configured to decode alternating periods of the shifted PWM signal; and
   a 2-bit-to-N-bit deserializer,
   wherein the controller is coupled to the first decoder core, the second decoder core, the sampler and retiming circuit,
   wherein the retiming circuit is configured to receive clock signals from the controller and to output half-rate even data from the first decoder core and half-rate odd data from the second decoder core, and
   wherein outputs of the retiming circuit for the half-rate even data and for the half-rate odd data and an output of the controller for a half-rate clock signal are coupled to inputs of the deserializer for parallel output of N bits.

2. The receiver of claim 1 wherein the deserializer is a 2-bit-to-10-bit serial-to-parallel converter for outputting 10 bits that represent a PWM symbol.

3. The receiver of claim 1 wherein the shifted PWM signal is a differential signal, wherein the controller is a flip-flop, wherein a clock input of the flip-flop is coupled to one of the pairs of the differential signal, wherein a data input of the flip-flop is coupled to a negated data output of the flip-flop for generating a negated clock signal, and wherein the flip-flop is configured to generate a clock signal as an output.

4. The receiver of claim 3 wherein the first decoder core is configured to decode an even path for the PWM signal and wherein the second decoder core is configured to decode an odd path for the PWM signal, wherein the second decoder core is configured to be reset by the clock signal, and wherein the first decoder core is configured to be reset by the negated clock signal.

5. The receiver of claim 1 wherein the first decoder core comprises a first integrator for charging for an entire period of the shifted PWM signal, a second integrator for charging for a positive portion of the shifted PWM signal, and a comparator for comparing an output of the first integrator with an output of the second integrator.

6. The receiver of claim 5
   wherein the shifted PWM signal is a differential signal having a positive signal and negative signal,
   wherein the first integrator comprises: a first current source; a second current source; a first switch; a second switch; a third switch; and a first capacitor,
   wherein the first current source and the first switch are serially connected across a supply voltage and a first node,
   wherein the first switch is configured to be operated by the negative signal,
   wherein the second current source and the second switch are serially connected across the supply voltage and the first node,
   wherein the second switch is configured to be operated by the positive signal,
   wherein the first capacitor and the third switch are connected in parallel across the first node and ground,
   wherein the first node is coupled to the comparator for sensing of a voltage VREF at the first node, and
   wherein the third switch is configured to be operated by one of a plurality of clock signals generated by the controller for resetting the first integrator.

7. The receiver of claim 6,
   wherein the second integrator comprises: a third current source, a fourth switch, a second capacitor, and a fifth switch,
   wherein the third current source and the fourth switch are serially connected across the supply voltage and a second node,
   wherein the second capacitor and the fifth switch are connected in parallel across the second node and ground,
   wherein the second node is coupled to the comparator for sensing of a voltage VPWM at the second node, and
   wherein the fifth switch is configured to be operated by a second one of the plurality of clock signals generated by the controller for resetting the second integrator.

8. The receiver of claim 7,
wherein the first current source, second current source, and third current source each is configured to generate a current IPWM,
wherein the second capacitor has a capacitance C, and
wherein the first capacitor has double the capacitance C.

9. The receiver of claim 7,
wherein third current source is configured to generate a current IPWM,
wherein the first current source and the second current source are each configured to generate half of the current IPWM, and
wherein the first capacitor and the second capacitor each has a capacitance C.

10. The receiver of claim 7,
wherein the receiver further comprises a voltage-to-current converter,
wherein the comparator is a current comparator,
wherein the first node and the second node are coupled to the voltage-to-current converter for converting the voltages VREF and VPWM to representative currents,
wherein outputs of the voltage-to-current converter is coupled to the current comparator for comparing the converted representative currents.

11. The receiver of claim 5,
wherein the shifted PWM signal is a differential signal having a positive signal and negative signal,
wherein the first integrator comprises: a first current source; a second current source; a first switch; a second switch; a third switch; and a first capacitor,
wherein the first current source is configured to be biased by a bias voltage Vbias via the first switch,
wherein the first switch is configured to be operated by the negative signal,
wherein the second current source is biased by the bias voltage Vbias via the second switch,
wherein second switch is configured to be operated by the positive signal,
wherein the first capacitor and the third switch are connected in parallel across a first node and ground,
wherein the first and second current sources are coupled to the first node for driving a current to the first capacitor,
wherein the first node is coupled to the comparator for sensing of a voltage VREF at the first node, and
wherein the third switch is configured to be operated by one of a plurality of clock signals generated by the controller for resetting the first integrator.

12. The receiver of claim 11,
wherein the second integrator comprises: a third current source, a fourth switch, a second capacitor, and a fifth switch,
wherein the third current source is biased by the bias voltage Vbias via the fourth switch,
wherein the second capacitor and the fifth switch are connected in parallel across a second node and ground,
wherein the third current source is coupled to the second node for driving a current to the second capacitor,
wherein the second node is coupled to the comparator for sensing of a voltage VPWM at the second node, and
wherein the fifth switch is configured to be operated by a second one of the plurality of clock signals generated by the controller for resetting the second integrator.

13. The receiver of claim 12,
wherein the first current source, second current source, and third current source each is configured to generate a current IPWM,
wherein the second capacitor has a capacitance C, and
wherein the first capacitor has double the capacitance C.

14. The receiver of claim 12,
wherein third current source is configured to generate a current IPWM,
wherein the first current source and the second current source are each configured to generate half of the current IPWM, and
wherein the first capacitor and the second capacitor each has a capacitance C.

15. The receiver of claim 12,
wherein the receiver further comprises a voltage-to-current converter,
wherein the comparator is a current comparator,
wherein the first node and the second node are coupled to the voltage-to-current converter for converting the voltages VREF and VPWM to representative currents,
wherein outputs of the voltage-to-current converter is coupled to the current comparator for comparing the converted representative currents.

16. A method for demodulating a pulse width modulated ("PWM") signal comprising the steps of:
shifting voltage levels of the PWM signal to predefined transistor voltage levels;
decoding the PWM signal using half-rate decoder cores into half-rate even data and half-rate odd data, wherein the half-rate decoder cores decode alternating periods of the shifted PWM signal;
sampling and retiming of the decoded half-rate even data and the decoded half-rate odd data for parallel output;
outputting the sampled half-rate even data and the sampled half-rate odd data in parallel using a half-rate clock signal; and
converting the outputted half-rate even data and the outputted half-rate odd data for parallel output by a 2-bit-to-N-bit deserializer.

17. The method of claim 16 wherein the PWM signal is a differential signal, wherein a flip-flop is clocked by one of the pairs of the differential signal to generate a clock signal and a negated clock signal, wherein the negated clock signal is generated by a negated data output of the flip-flop that is coupled to a data input of the flip-flop, and wherein the clock signal is generated by a data output of the flip-flop.

18. The method of claim 17 wherein the clock signal is used as a discharging signal for the decoder core used for decoding the half-rate odd data and the negated clock signal is used as a discharging signal for the decoder core used for decoding the half-rate even data.

19. The method of claim 16 wherein, in the decoding the PWM signal using the half-rate decoder cores, further comprising the sub-steps for each of the decoder cores:
generating a voltage VREF by integrating over a full period of the PWM signal;
generating a voltage VPWM by integrating over a positive portion of the PWM signal;
comparing the voltage VREF and the voltage VPWM with a comparator; and
determining a PWM logic level for the full period of the PWM signal based on the comparison of the voltage VREF and the voltage VPWM.

20. The method of claim 19 wherein, in the comparing the voltage VREF and the voltage VPWM sub-step, further comprising the steps of:

converting the voltage VREF and the voltage VPWM into respective current values; and comparing the respective current values using a current comparator.

\* \* \* \* \*